(12) United States Patent
Gyoten

(10) Patent No.: US 10,211,828 B2
(45) Date of Patent: Feb. 19, 2019

(54) DRIVING DEVICE FOR INSULATED GATE SEMICONDUCTOR ELEMENT, AND DRIVING SYSTEM FOR THE SAME ELEMENT

(71) Applicant: Panasonic Intellectual Property Management Co., Ltd., Osaka (JP)

(72) Inventor: Takaaki Gyoten, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 8 days.

(21) Appl. No.: 15/671,808

(22) Filed: Aug. 8, 2017

(65) Prior Publication Data

US 2018/0069545 A1 Mar. 8, 2018

(30) Foreign Application Priority Data

Sep. 8, 2016 (JP) .................................. 2016-175604
Jun. 21, 2017 (JP) .................................. 2017-121015

(51) Int. Cl.
*H03K 17/567* (2006.01)

(52) U.S. Cl.
CPC .................................. *H03K 17/567* (2013.01)

(58) Field of Classification Search
CPC ...... H03K 17/00; H03K 17/567; H03K 19/00; H03K 19/00315; H03K 19/00361; H03K 19/00384; H04L 25/00; H04L 25/0272; H04L 25/028
USPC ........................................................ 327/108
See application file for complete search history.

(56) References Cited

U.S. PATENT DOCUMENTS

| 7,714,548 | B1* | 5/2010 | Wittenbreder, Jr. | H02M 1/083 323/235 |
| 2005/0285661 | A1* | 12/2005 | Wittenbreder, Jr. | H02M 1/08 327/434 |
| 2015/0124507 | A1* | 5/2015 | Ridder | H03K 17/04123 363/127 |

FOREIGN PATENT DOCUMENTS

| JP | 8-149796 | 6/1996 |
| JP | 2004-357457 | 12/2004 |
| JP | 2007-336694 | 12/2007 |

* cited by examiner

*Primary Examiner* — Lincoln Donovan
*Assistant Examiner* — David Mattison
(74) *Attorney, Agent, or Firm* — Wenderoth, Lind & Ponack, L.L.P.

(57) ABSTRACT

A driving device includes: a driving circuit operating with a single power supply in accordance with a driving signal; a first parallel circuit formed of a first capacitor and a first zener diode connected together in parallel, and having a first end connected to an output terminal of the driving circuit; a series circuit connected between a second end of the first parallel circuit and a ground of the driving circuit, and formed of a diode and a second parallel circuit (of a second capacitor and a second zener diode) connected to each other in series; and a resistor is connected between the second end of the first parallel circuit and the ground of the driving circuit. A voltage across the resistor is used as an output voltage for driving the insulated gate semiconductor element. A voltage across the first capacitor is superimposed negative-wise on the output voltage.

5 Claims, 8 Drawing Sheets

DRIVING DEVICE FOR INSULATED GATE SEMICONDUCTOR ELEMENT, AND DRIVING SYSTEM FOR THE SAME ELEMENT

TECHNICAL FIELD

The present disclosure relates to a driving device for on-off driving the insulated gate semiconductor element including such as a GaN field effect transistor (FET) and a silicon carbide FET featuring ultrahigh speed switching characteristics.

BACKGROUND ART

Patent literature 1 discloses a driving circuit for driving an insulated gate semiconductor element. This driving circuit allows applying a reverse bias voltage at a turn-off with a simple structure employing a single dc power supply.

The driving circuit disclosed in patent literature 1 drives an insulated gate semiconductor element that controls, in response to the gate voltage, an electric current flowing between the emitter connected to the ground-line and the collector to which a given voltage is applied. This driving circuit comprises the following structural elements:
 a pair of transistors, connected in series between the ground line and a voltage line to which a dc voltage is applied, for controlling a gate voltage of the insulated gate semiconductor element;
 a voltage clamping circuit for holding the gate voltage lower than the dc voltage; and
 a capacitor connected between the gate of the insulated gate semiconductor element and a junction point of the pair of transistors, and charged when the element is turned on while generating a reverse bias voltage when the insulated gate semiconductor element is turned off.

CITATION LIST

Patent Literature 1: Unexamined Japanese Patent Application Publication No. 2007-336694

SUMMARY

The driving circuit discussed above, however, cannot supply a given negative voltage to an insulated gate semiconductor element in an off period across a rather wide range of an on-duty ratio (a time ratio of on vs off of a driving signal), and yet in the first cycle of a driving signal being turned on after having been kept at off for a long time.

The present disclosure provides a driving device for an insulated gate semiconductor element in a rather simpler structure than a conventional technique. This driving device allows supplying a given negative voltage to the insulated gate semiconductor element in an off periods across a rather wide range of an on-duty ratio, and yet in the first cycle of a driving signal being turned on after having been kept at off for a long time.

The driving device for the insulated gate semiconductor element of the present disclosure drives the insulated gate semiconductor element in accordance with a given driving signal. The driving device includes the following structural elements:
 a driving circuit operating with a single power supply in accordance with the driving signal;
 a first parallel circuit formed of a first capacitor and a first zener diode connected together in parallel, and having a first end connected to an output terminal of the driving circuit;
 a series circuit connected between a second end of the first parallel circuit and a ground of the driving circuit, and formed of a diode and a second parallel circuit connected to each other in series, the second parallel circuit being formed of a second capacitor and a second zener diode, and
 a resistor connected between the second end of the first parallel circuit and the ground of the driving circuit.

In this driving device, a voltage across the resistor is used as an output voltage for driving the insulated gate semiconductor element, and a voltage across the first capacitor is superimposed, negative-wise on the output voltage for generating a negative voltage of the output voltage.

The structure discussed above allows the driving device for the insulated gate semiconductor element, in accordance with the present disclosure and having a rather simpler structure than a conventional technique, to supply a given negative voltage during off-periods across a rather wide range of an on-duty ratio, and yet in the first cycle of the driving signal being turned on after having been kept at off for a long time. This structure thus allows the driving device to drive steadily the insulated gate semiconductor element including such as GaN-FET and silicon carbide FET featuring ultrahigh speed switching characteristics free from influence of noises due to parasitic inductance on a source electrode.

DETAILED DESCRIPTION OF PREFERRED EMBODIMENTS

Exemplary embodiments of the present disclosure are detailed with reference to the accompanying drawings. Descriptions more than necessary are sometimes omitted. For instance, descriptions of well-known matters or duplicated descriptions of substantially the same structural elements are sometimes omitted. These omissions will avoid redundant descriptions and aid the ordinary skilled person in the art to understand the embodiments with ease.

The accompanying drawings and the descriptions below are provided for the ordinary skilled person in the art to fully understand the present disclosure, and these materials do not limit the scope of the claims thereto.

First Exemplary Embodiment

The first embodiment is demonstrated hereinafter with reference to FIG. 1 and FIGS. 4-7.

1-1. Structure

Figure 1:
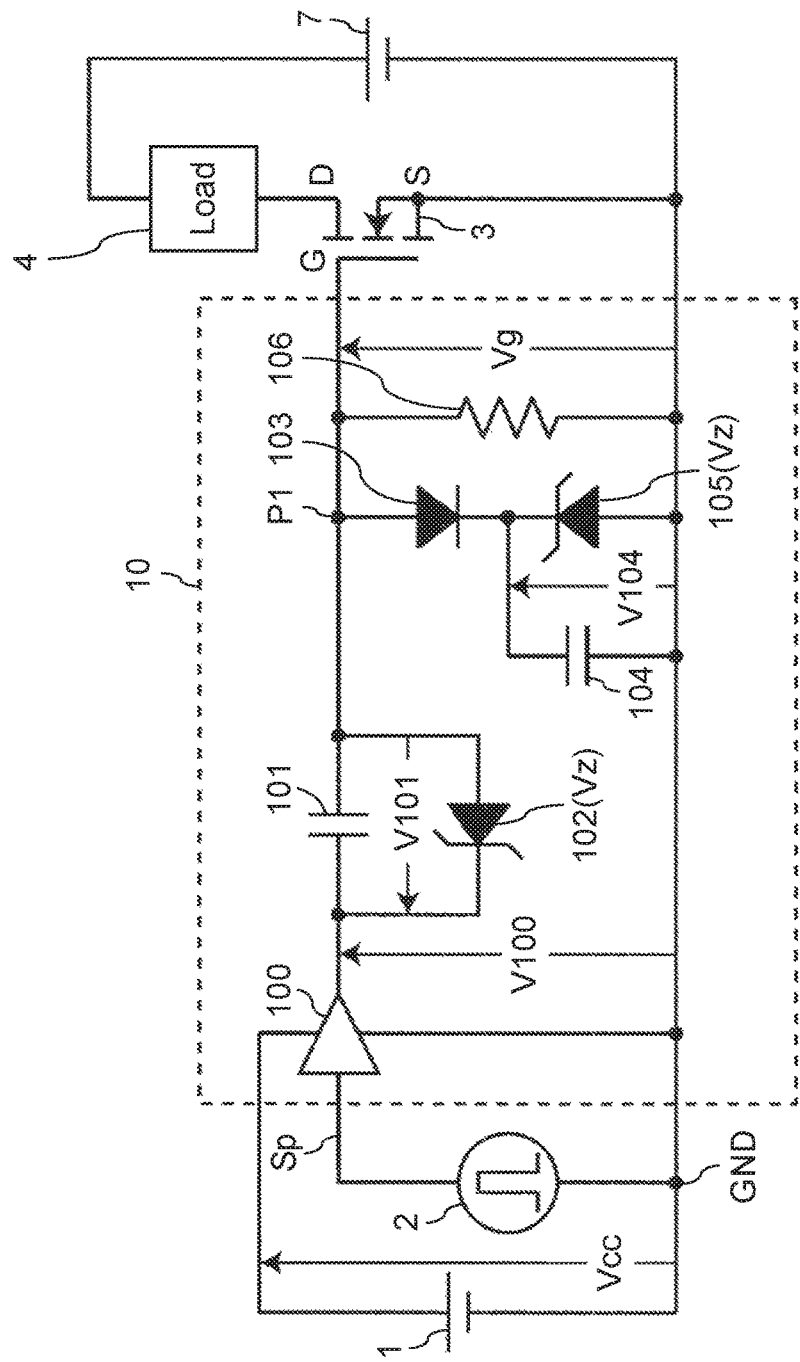
FIG. 1 is a circuit diagram illustrating an example of a structure of driving device 10 for an insulated gate semiconductor element in accordance with a first embodiment of the present disclosure.

FIG. 1 is a circuit diagram showing an example of a structure of driving device 10 for an insulated gate semiconductor element in accordance with the first embodiment. As FIG. 1 shows, driving device 10 in accordance with this first embodiment comprises the following structural elements:

driving circuit 100 acting with a single power supply;
capacitor 101;
zener diode 102;
diode 103;
capacitor 104;
zener diode 105; and
resistor 106.

In this context, the single power supply refers to a single dc voltage source.

In FIG. 1, driving circuit 100 acts with dc voltage source 1 having power supply voltage Vcc, and follows pulse width modulation (PWM) signal Sp that is a driving signal supplied from driving signal generator 2, thereby generating output voltage V100 that varies from 0V to power supply voltage Vcc. Driving circuit 100 is, for example, formed of a push-pull type amplifying circuit disclosed in patent literature 1 and directly connected with a pair of transistors. An output terminal of driving circuit 100 is connected with a parallel circuit formed of capacitor 101 and zener diode 102. The output terminal of driving circuit 100 is connected with a cathode of zener diode 102.

An anode of zener diode 102 is connected to junction point P1, of which voltage is output to gate G of insulated gate semiconductor element 3 as gate driving voltage Vg of driving device 10. On top of that, a series circuit formed of load 4 and dc voltage source 7 is connected between drain D and source S of insulated gate semiconductor element 3. A positive electrode of dc voltage source 7 is, for instance, connected to drain D of insulated gate semiconductor element 3 via load 4, and a negative electrode thereof is connected to ground GND of driving circuit 100.

Junction point P1 is connected with an anode of diode 103, and a cathode of diode 103 is connected with a parallel circuit formed of capacitor 104 and zener diode 105. The cathode of diode 103 is connected with a cathode of zener diode 105, and an anode of zener diode 105 is connected to ground GND of driving circuit 100. Resistor 106 is connected between junction point P1 and ground GND.

Driving device 10, shown in FIG. 1 for the insulated gate semiconductor element is used in a circuit that drives the insulated gate semiconductor element including such as GaN-FET or silicon carbide FET featuring ultrahigh speed switching characteristics. These insulated gate semiconductor elements are incorporated in a down-chopper switching power supply or an H-bridge circuit that drives a motor.

1-2. Operations

Operations of the foregoing driving device 10 for an insulated gate semiconductor element are demonstrated hereinafter with reference to FIG. 1 and FIGS. 4-7.

Figure 4:
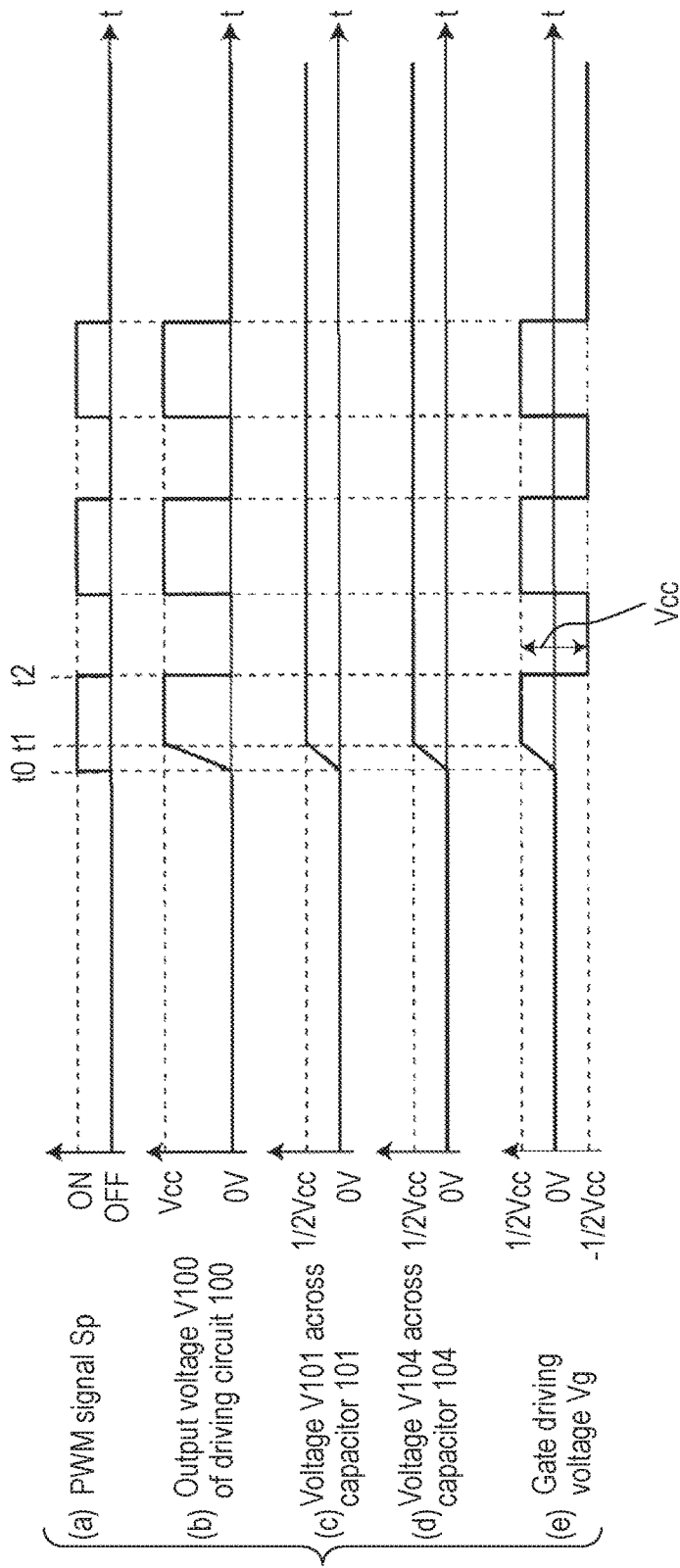
FIG. 4 is a timing chart showing operations of driving device 10 shown in FIG. 1 at on-duty ratio=50%.

FIG. 4 is a timing chart showing operations of driving device 10 at on-duty ratio=50%. In FIG. 4, driving circuit 100 works at power supply voltage Vcc of dc voltage source 1, and generates output voltage V100 varying from 0V to power supply voltage Vcc following PWM signal Sp. The example shown in FIG. 4 is set under the following conditions 1-5:

1. On-duty ratio of PWM signal Sp is 50%.
2. Capacitor 101 and capacitor 104 have the same capacity.
3. The capacity of capacitor 101 and capacitor 104 is greater enough than an input capacity of insulated gate semiconductor element 3.
4. Zener voltage Vz of zener diode 102 is equal to zener voltage Vz of zener diode 105.
5. Zener voltage Vz is greater than voltage 1/2 Vcc.

While driving device 10 for the insulated gate semiconductor element stays out of operation, output voltage V100 of driving circuit 100 is kept at 0 V. Since resistor 106 is put between junction point P1 and ground GND of driving circuit 100, if electric charges were stored in capacitor 101, the charges are discharged by resistor 106, so that gate driving voltage Vg of driving device 10 can be maintained at 0 V.

If electric charges were stored in capacitor 104 with a polarity that makes a cathode potential of zener diode 105 higher than an anode potential thereof, and when an electric potential of junction point P1 stays at 0 V, a cathode potential of diode 103 becomes higher than an anode potential thereof, so that diode 103 is turned off. As a result, gate driving voltage Vg of driving device 10 is kept at 0 V. If electric charges were stored in capacitor 104 with a polarity that makes a cathode potential of zener diode 105 lower than an anode potential thereof, the charges are discharged by resistor 106, so that gate driving voltage Vg of driving device 10 is kept at 0 V.

The mechanism discussed above allows gate driving voltage Vg of driving device 10 to be kept at 0 V when driving device 10 stays out of operation.

As FIG. 4 shows, when PWM signal Sp (denoted by (a) in FIG. 4) changes to ON after a long time OFF (denoted by t0), driving circuit 100 tries to output voltage V100, however, since capacitors 101 and 104 are not yet charged, the voltages across each one of capacitors 101 and 104 stay at 0. A bias voltage is applied to diode 103 in forward direction, then diode 103 is turned on. The charging electric current run through capacitors 101 and 104, so that output voltage V100 (denoted by (b) in FIG. 4) of driving circuit 100 gradually rises to power supply voltage Vcc (t1). Since capacitors 101 and 104 are connected in series, the same amount of electric current runs through them, so that capacitors 101 and 104 are charged to voltages inversely proportional to a ratio of their capacities.

If the capacity of capacitor 101 is equal to that of capacitor 104, they are charged up to a half of power supply voltage Vcc. In other words, both of voltage V101 (denoted by (c) in FIG. 4) across capacitor 101 and voltage V104 (denoted by (d) in FIG. 4) across capacitor 104 rise to voltage 1/2 Vcc. Gate driving voltage Vg (denoted by (e) in FIG. 4) also rises to voltage 1/2 Vcc.

Then when PWM signal Sp turns to OFF (t2), driving circuit 100 outputs 0 V. At this time, the anode potential of diode 103 is biased negatively with respect to the output voltage, viz. 0 V from driving circuit 100. This bias is caused by voltage 1/2 Vcc charged to capacitor 101. As a result, the anode potential of diode 103 becomes −1/2 Vcc. The cathode potential of diode 103 becomes voltage 1/2 Vcc that is charged to capacitor 104, so that diode 103 is reversely biased by voltage Vcc and turns to OFF. The voltage across capacitor 101 is superimposed, along a negative direction, on output voltage V100 from driving circuit 100, whereby a stable negative gate driving voltage Vg can be obtained.

On top of that, when PWM signal Sp turns to ON tentatively, capacitors 101 and 104 are charged to voltages in response to their capacity ratio, so that the negative gate driving voltage Vg can be supplied right after the input of PWM signal Sp during the OFF time of PWM signal Sp. The sum of an amplitude of a positive output voltage when PWM signal Sp stays at ON and an amplitude of the negative output voltage when PWM signal Sp stays at OFF is equal to power supply voltage Vcc. A ratio of these amplitudes is inversely proportional to the capacity ratio of capacitor 101 vs capacitor 104. Use of the characteristics discussed above allows setting the amplitudes, of the positive output voltage when PWM signal Sp stays at ON and the negative output voltage when PWM signal Sp stays at OFF, at any values.

Figure 5:
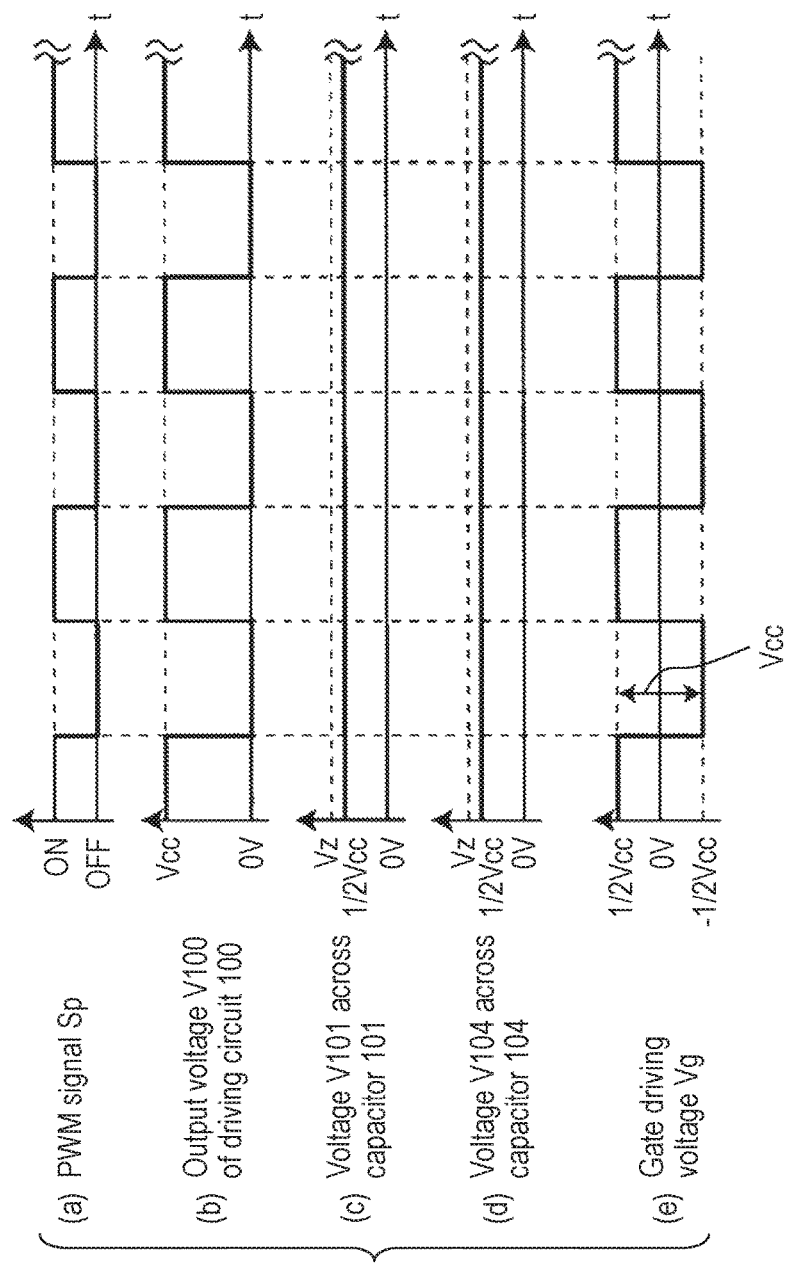
FIG. 5 is a timing chart showing operations of driving device 10 shown in FIG. 1 after a long time from the end of the operations shown in FIG. 4.

FIG. 5 is a timing chart showing operations after a lapse of long time from the end of the operations shown in FIG. 4 of driving device 10 shown in FIG. 1. The example shown in FIG. 5 is done under the same conditions as the foregoing conditions 1-5 applied to the example in FIG. 4.

Gate driving voltage Vg denoted by (e) in FIG. 5 is applied to resistor 106. When PWM signal Sp has a 50% on-duty ratio, an average voltage of gate driving voltage Vg becomes 0 (zero) because positive and negative amplitudes are equal to each other, and yet, their time-widths are also equal to each other. An average electric current running through resistor 106 thus becomes 0 (zero). In the status discussed above, capacitors 101 and 104 are charged up to a voltage of 1/2 Vcc respectively, and when PWM signal Sp stays at ON, viz. when output voltage V100 from driving circuit 100 is equal to power supply voltage Vcc, the voltage across the series circuit formed of capacitors 101 and 104 becomes equal to power supply voltage Vcc. The voltage across diode 103 thus becomes 0 (zero), so that no electric current runs through diode 103.

When PWM signal Sp stays at OFF, viz. when output voltage V100 from driving circuit 100 is equal to 0 (zero), diode 103 is reversely biased with power supply voltage Vcc by the series circuit formed of capacitors 101 and 104, so that no electric current runs through diode 103 too. At this time, no current also runs to gate G of insulated gate semiconductor element 3, so that an average value of electric current running through capacitor 101 becomes 0 (zero) in the status represented by the waveform shown in FIG. 5. As a result, capacitor 101 keeps the voltage at 1/2 Vcc, and the output voltage from driving device 10, like the gate driving voltage Vg shown in FIG. 5 (e), becomes +1/2 Vcc when PWM signal Sp stays at ON, and it becomes −1/2 Vcc when PWM signal Sp stays at OFF.

Figure 6:
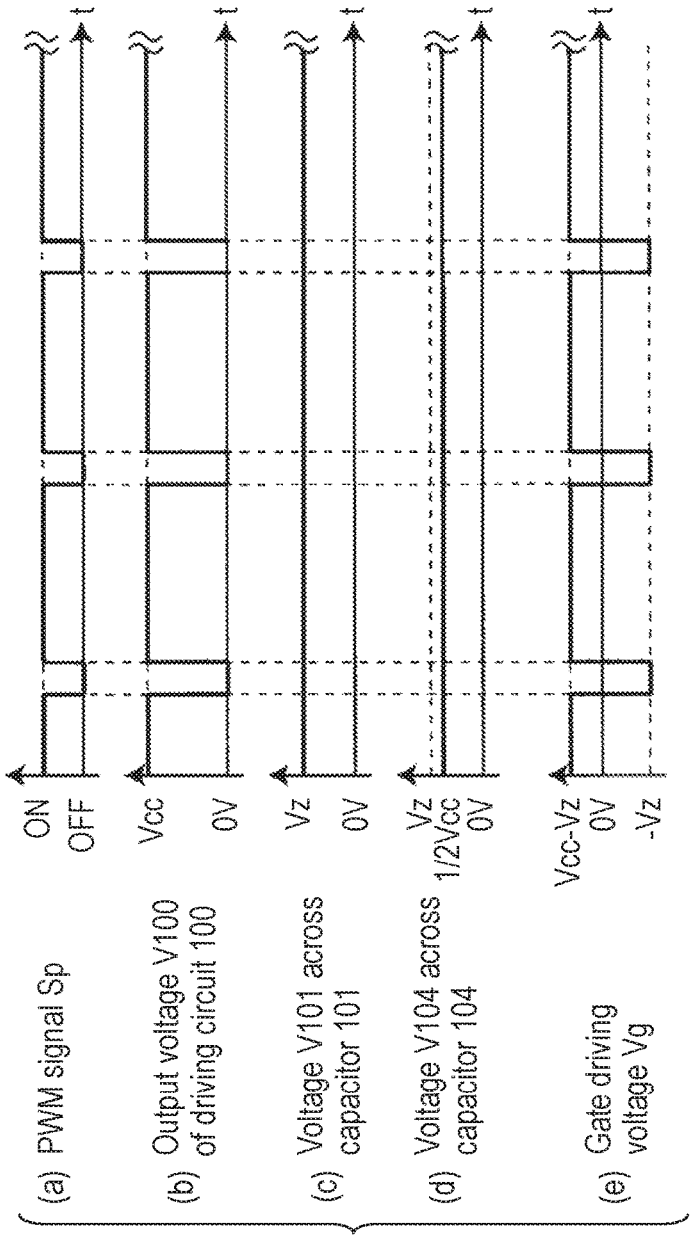
FIG. 6 is a timing chart showing operations of driving device 10 shown in FIG. 1 at on-duty ratio=80%.

FIG. 6 is a timing chart showing operations when ON-duty ratio stays 80% in driving device 10 shown in FIG. 1. In other words, FIG. 6 shows the status in which the ON duty ratio of PWM signal Sp has been kept at 50%, and then the ratio is changed to 80%. The example shown in FIG. 6 is done under the same conditions as the conditions 1-5 described in FIG. 4.

Gate driving voltage Vg dented by (e) in FIG. 6 is applied to resistor 106. When PWM signal Sp stays at ON duty ratio of 80% gate driving voltage Vg becomes a voltage of 1/2 Vcc right after the ON duty ratio of PWM signal Sp turns to 80% from a long period of OFF state because a voltage ratio of capacitor 101 vs. capacitor 104 is inversely proportionate to a ratio of their capacities. The time ratio between them is 80% during the ON period and 20% during the OFF period, and average voltage Va can be expressed by equation (1) below:

$$Va = 1/2 \, Vcc \times (0.8-0.2) = 0.3 \, Vcc \quad (1)$$

This equation shows that an average electric current of 0.3 Vcc/resistance value of resistor 106 runs through resistor 106.

In the foregoing state, the voltage of approx. 1/2 Vcc is charged to capacitors 101 and 104, and when PWM signal Sp stays ON, viz. output voltage V100 from driving circuit 100 is power supply voltage Vcc, the voltage across the series circuit formed of capacitors 101 and 104 becomes equal to power supply voltage Vcc. The voltage across diode 103 thus becomes 0 (zero), so that no electric current runs through diode 103, however, capacitor 101 is charged a little by the electric current running through resistor 106. When PWM signal Sp stays at OFF, viz. output voltage V100 from driving circuit 100 is 0 (zero) V, diode 103 is reversely biased with power supply voltage Vcc by the series circuit formed of capacitors 101 and 104, so that no electric current runs through diode 103 too. However, capacitor 101 is discharged a little by the electric current flowing through resistor 106. The difference in these electric currents is the average electric current of 0.3 Vcc/resistance value of resistor 106, and this average current runs through resistor 106. As a result, capacitor 101 is charged, and the voltage V101 across capacitor 101 rises.

Next, when voltage V101 across capacitor 101 reaches to zener voltage Vz of zener diode 102, an electric current flows through zener diode 102, so that the electric current having flowed into capacitor 101 is bypassed. As a result, the voltage of capacitor 101 stops rising at zener voltage Vz.

When PWM signal Sp stays at ON with voltage V101 across capacitor 101 staying at zener voltage Vz, viz. when output voltage V100 from driving circuit 100 becomes power supply voltage Vcc, the anode potential of diode 103, viz. gate driving voltage Vg of driving device 10 becomes voltage (Vcc−Vz). In this state, the cathode potential of zener diode 105 is equal to voltage 1/2 Vcc that has been charged to capacitor 104, and zener voltage Vz has been chosen to be smaller than voltage 1/2 Vcc, so that no electric current flows through zener diode 105.

Next, when PWM signal Sp stays at OFF with voltage V101 across capacitor 101 staying at zener voltage Vz, viz. when output voltage V100 from driving circuit 100 becomes 0 (zero), the anode potential of diode 103, viz. gate driving voltage Vg of driving device 10, becomes voltage −Vz. In this state, the cathode potential of diode 103 is equal to voltage 1/2 Vcc that has been charged to capacitor 104, and the anode potential of diode 103 is −Vz. Diode 103 is thus reversely biased, so that no electric current flows through diode 103.

Figure 7:
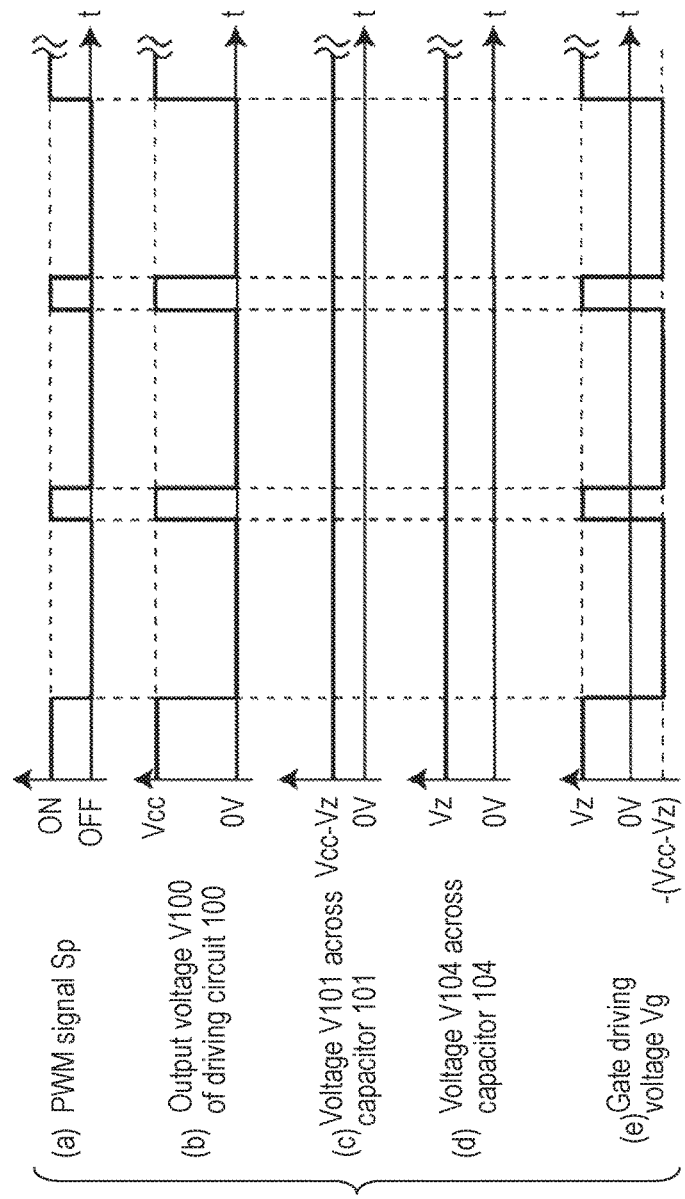
FIG. 7 is a timing chart showing operations of driving device 10 shown in FIG. 1 at on-duty ratio=20%.

FIG. 7 is a timing chart showing operations in driving device 10, shown in FIG. 1. The operations are observed when ON duty ratio stays at 20%. In other words, FIG. 7 shows a state in which the ON duty ratio of PWM signal Sp changes to 20% after the ratio has stayed at 50%. The conditions 1-5 described in the example shown in FIG. 4 are also applicable to this example shown in FIG. 7.

Gate driving voltage Vg (denoted by (e) in FIG. 7) is applied across resistor 106. In this state, when the ON duty ratio of PWM signal Sp is 20%, and yet, right after the ON duty ratio of PWM signal Sp turns to 20% from a long-time OFF period, the voltage ratio of capacitor 101 vs. capacitor 104 is reversely proportionate to their capacities, so that their voltages become the voltage of 1/2 Vcc respectively. A time ratio is 20% for ON period, and 80% for OFF period. Average voltage Va is expressed equation (2) below:

$$Va = -1/2\ Vcc \times (0.8-0.2) = -0.3\ Vcc \quad (2)$$

Equation (2) shows that an average electric current of −0.3 Vcc/resistance value of resistor 106 flows through resistor 106. In the foregoing state, the voltage of approx. 1/2 Vcc is charged to capacitors 101 and 104, and when PWM signal Sp stays ON, viz. when output voltage V100 from driving circuit 100 is power supply voltage Vcc, the voltage across the series circuit formed of capacitors 101 and 104 becomes equal to power supply voltage Vcc. The voltage across diode 103 thus becomes 0 (zero), so that no electric current runs through diode 103, however, capacitor 101 is charged a little by the electric current running through resistor 106.

When PWM signal Sp stays at OFF, viz. when output voltage V100 from driving circuit 100 is 0 (zero) V, diode 103 is reversely biased with power supply voltage Vcc by the series circuit formed of capacitors 101 and 104, so that no electric current runs through diode 103 too. However, capacitor 101 is discharged a little by the electric current flowing through resistor 106. The difference in these electric currents is the electric current of −0.3 Vcc/resistance value of resistor 106. As a result, capacitor 101 is discharged, and the voltage V101 across capacitor 101 lowers.

Then a decline of voltage V101 across capacitor 101 increases the anode potential of diode 103 by an amount of increased voltage caused by the discharge, and diode 103 is forward biased, so that an electric current runs through capacitor 104, and voltage V104 across capacitor 104 rises.

When voltage V104 across capacitor 104 reaches to zener voltage Vz, an electric current flows through zener diode 105, so that the voltage stops increasing in capacitor 104. The electric current flowing through zener diode 105 has characteristics of sharply increasing when the voltage applied thereto exceeds zener voltage Vz.

In this state, the electric current for charging capacitor 101 sharply increases during the ON period of PWM signal Sp, the electric current running through zener diode 105 for charging capacitor 101 becomes in balance with the electric current discharged from capacitor 101 and running through resistor 106 on a condition in which voltage V104 across capacitor 104 becomes equal to zener voltage Vz. Voltage V104 (denoted by (d) in FIG. 7) across capacitor 104 thus becomes equal to zener voltage Vz, and voltage V101 (denoted by (c) in FIG. 7) across capacitor 101 becomes equal to voltage (Vcc−Vz).

While voltage V101 across capacitor 101 becomes voltage (Vcc−Vz), and yet, when PWM signal Sp stays at ON, viz. when output voltage V100 from driving circuit 100 is equal to power supply voltage Vcc, the anode potential of diode 103, namely, gate driving voltage Vg of driving device 10 becomes zener voltage Vz. In this state, the cathode potential of diode 103 is zener voltage Vz that is charged to capacitor 104, so that no electric current flows through diode 103.

The operations discussed above allow gate driving voltage Vg to fall within the range from Vz to Vcc−Vz when PWM signal Sp stays at ON, provided the following conditions are fulfilled:
the capacity of capacitor 101 is equal to that of capacitor 104;
the capacity of capacitor 101 is greater enough than an input capacitance of insulated gate semiconductor element 3;
zener voltage Vz of zener diode 102 is equal to that of zener diode 105; and
zener voltage Vz is greater than voltage 1/2 Vcc.

The operations discussed above also allow gate driving voltage Vg to fall within the range from −Vz to −(Vcc−Vz) when PWM signal stays at OFF.

If zener voltage Vz were set to voltage 1/2 Vcc, gate driving voltage Vg can be adjusted to voltage 1/2 Vcc when PWM signal Sp stays at ON, and it can be adjusted to voltage −1/2 Vcc when PWM signal Sp stays at OFF.

If a user wants to adjust a ratio of gate driving voltage Vg during ON of PWM signal Sp vs. voltage Vg during OFF of PWM signal Sp, for instance, if the user wants to adjust the above ratio to such as voltage Vg at ON is voltage 2/3 Vcc and voltage Vg at OFF is −1/3 Vcc, then capacity ratio of capacitor 101 vs. capacitor 104 should be 2/3:1/3, zener voltage Vz of zener diode 102 should be voltage 1/3 Vcc, and zener voltage Vz of zener diode 105 should be voltage 2/3 Vcc.

1-3. Advantage

As discussed above, the first embodiment proves that the superimposition of the voltage across capacitor 101 on the output voltage from driving circuit 100 along a negative-wise line allows obtaining stable negative gate driving voltage Vg. This mechanism allows driving device 10 for an insulated gate semiconductor element, employing a single dc power supply to achieve the following advantage with a structure simpler than that of a conventional technique. Supply of a given negative voltage during OFF period is achieved in a rather wide range of ON duty ratio of the driving signal, and yet, in the first cycle where the driving signal turns to ON after having stayed at OFF for a long time. This advantage allows driving, steadily and free from noise-influence caused by parasitic inductance on the source electrode, the insulated gate semiconductor element featuring ultra-high speed switching characteristics and including such as GaN-FET, silicon carbide FET.

Second Exemplary Embodiment

The second exemplary embodiment is demonstrated hereinafter with reference to FIG. 2.

2-1. Structure

Figure 2:
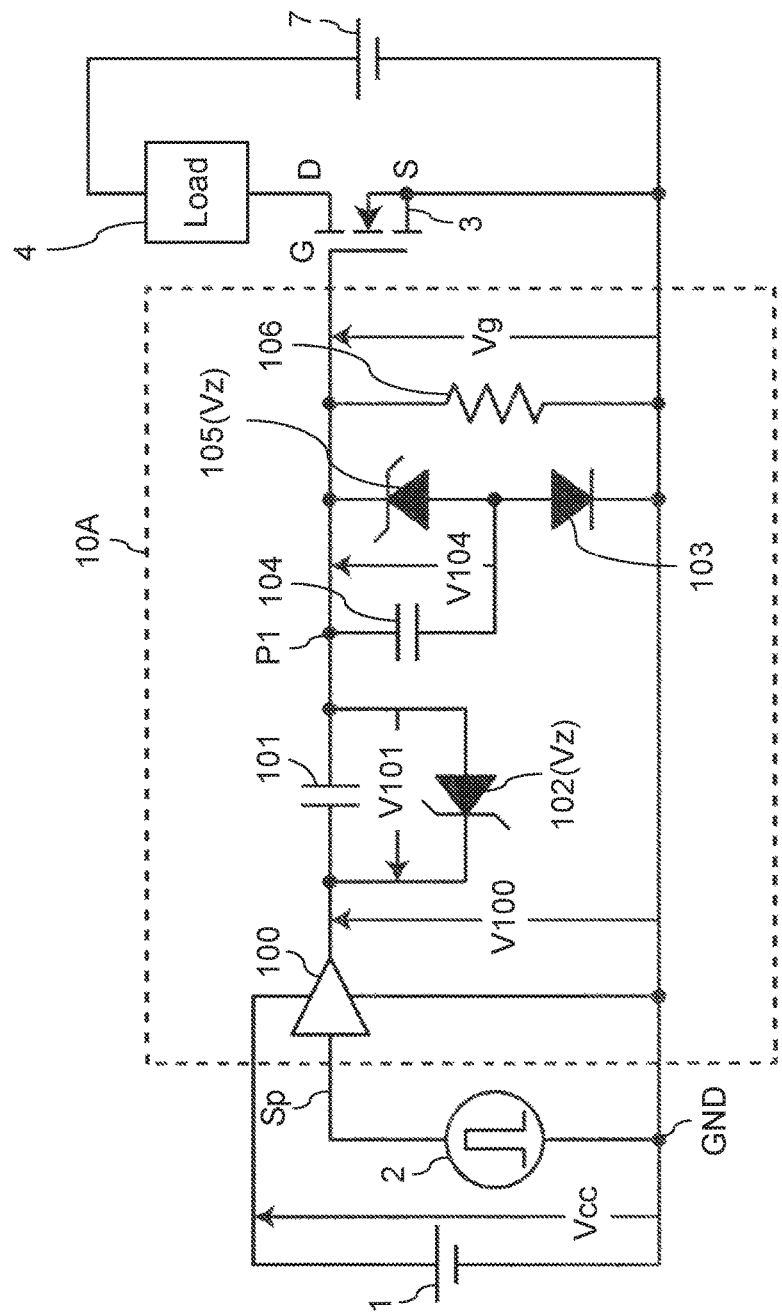
FIG. 2 is a circuit diagram illustrating an example of a structure of driving device 10A for an insulated gate semiconductor element in accordance with a second embodiment of the present disclosure.

FIG. 2 is a circuit diagram showing a structural example of driving device 10A for an insulated gate semiconductor element in accordance with the second embodiment. Driving device 10A differs from driving device 10 in accordance with the first embodiment in the following point (1):

(1) The parallel circuit formed of zener diode 105 and capacitor 104 is connected to diode 103 in series. The order of this connection is alternated with that of driving device 10.

This different point is detailed below:

In FIG. 2, the cathode of diode 103 is connected to ground GND of driving circuit 100, the anode of diode 103 is connected to the anode of zener diode 105, and the cathode of zener diode 105 is connected to junction point P1, while capacitor 104 is connected to zener diode 105 in parallel.

2-2. Operation

Although driving device 10A for an insulated gate semiconductor element in accordance with the second embodiment includes the foregoing different structure, viz. the connecting order of the parallel circuit formed of zener diode 105 and capacitor 104 to diode 103 in series is alternated with that in driving device 10 in accordance with the first embodiment, driving device 10A thus can do the same operation as driving device 10.

2-3. Advantage

Driving device 10A for an insulated gate semiconductor element in accordance with the second embodiment carries out the same operation as that of driving device 10 in accordance with the first embodiment, so that driving device 10A can achieve the same advantage.

Third Exemplary Embodiment

The third embodiment is demonstrated hereinafter with reference to FIG. 3 and FIG. 8.

3-1. Structure

Figure 3:
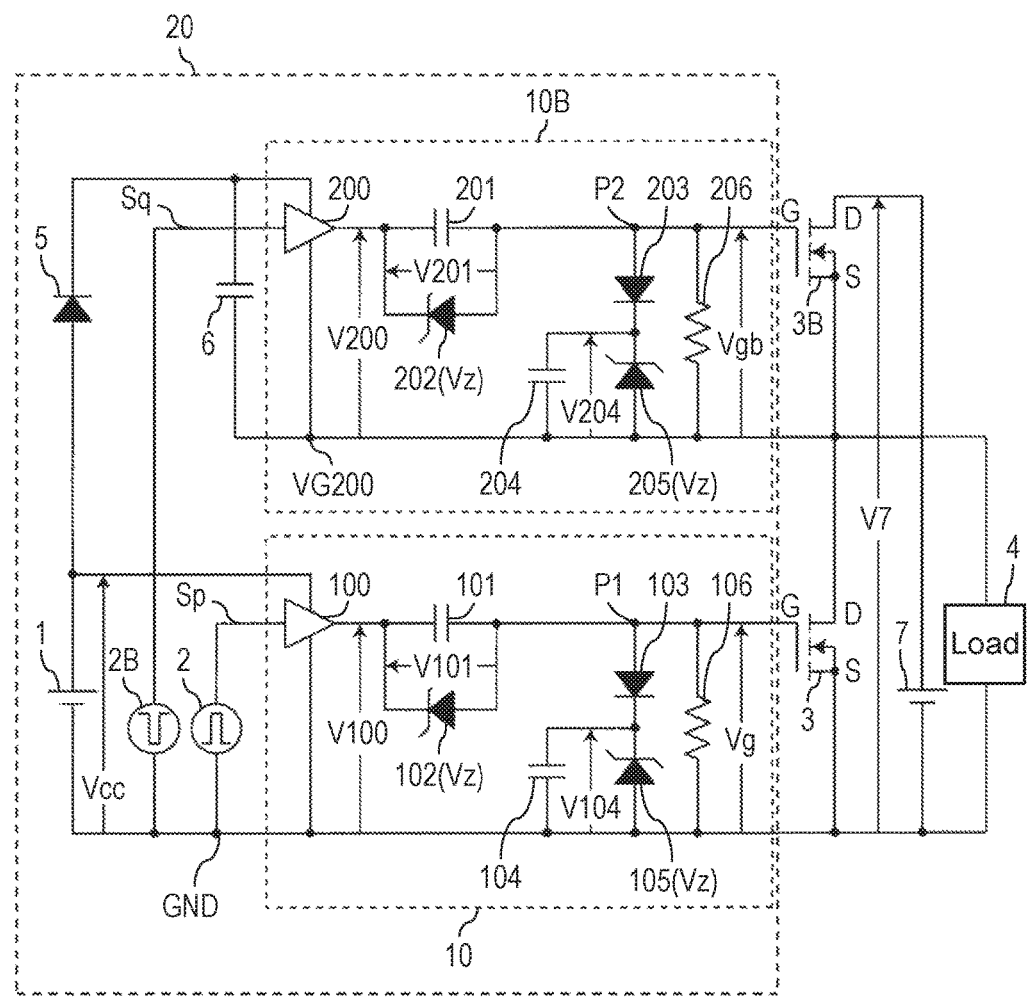
FIG. 3 is a circuit diagram illustrating an example of a structure of driving system 20 for an insulated gate semiconductor element in accordance with a third embodiment of the present disclosure.

FIG. 3 is a circuit diagram showing a structural example of driving system 20 for an insulated gate semiconductor element in accordance with the third embodiment. Driving system 20 in accordance with the third embodiment includes driving device 10 in accordance with the first embodiment and another driving device 10B formed of a structure similar to driving device 10. This driving system 20 can drive two insulated gate semiconductor elements 3 and 3B. Driving system 20 differs from driving device 10 in accordance with the first embodiment in the following points 1-4.

1. Driving system 20 includes driving device 10 and driving device 10B that is formed identically to driving device 10. To be more specific, driving device 10B includes, similarly to driving device 10, driving circuit 200, capacitor 201, zener diode 202, diode 203, capacitor 204, zener diode 205, and resistor 206. These structural elements are connected to each other in a similar manner to driving device 10. Driving circuit 200 is operated by a single power supply, and a transformer insulates between an input terminal and an output terminal of driving circuit 200, so that an input-output isolation type driving circuit is formed. Capacitor 201 is connected to diode 203 at junction point P2.

2. A positive power-supply terminal of driving circuit 200 is applied with power supply voltage Vcc supplied from dc voltage source 1 via diode 5. Between the positive power-supply terminal and a negative power-supply terminal of driving circuit 200, capacitor 6 is connected. Driving circuit 200 is driven by a dc voltage.

3. An input terminal of driving circuit 200 receives PWM signal Sq supplied from driving signal generator 2B. PWM signal Sq becomes ON in a time period different from that of PWM signal Sp supplied to driving circuit 100, and has a reverse polarity to PWM signal Sp.

4. Gate driving voltage Vgb of driving device 10B is applied to insulated gate semiconductor element 3B at gate G, and load 4 is connected between drain D and source S of element 3.

In other words, driving system 20 in accordance with the third embodiment has the following structural features: in FIG. 3, driving circuit 200 forms the input-output isolation type driving circuit, and includes capacitor 6 between the power supply terminals. Driving circuits 100 and 200 are driven by a pair of driving signals (i.e. PWM signals Sp, Sq) having reverse polarities to each other in time periods different from each other. Driving circuit 200 is driven by dc voltage source 1 (first single power supply) via diode 5. On top of that, driving system 20 includes another single power supply (second single power supply), viz. dc voltage source 7, between the output terminal of driving device 10B and ground GND of driving circuit 100 via insulated gate semiconductor element 3B that is driven by driving device 10B.

3-2. Operation

Driving system 20 for the insulated gate semiconductor element thus includes driving circuits 100 and 200 that drive insulated gate semiconductor elements 3 and 3B respectively. This driving system 20 carries out the following operations.

Driving device 10 of driving system 20 uses driving circuit 100 driven by power supply voltage Vcc of which reference is ground GND of dc voltage source 1, and carries out the same operation as driving device 10 of the insulated gate semiconductor element shown in FIG. 1. Driving device 10B uses driving circuit 200 driven by power supply voltage Vcc of which reference is ground potential VG200 of driving circuit 200 to act. Ground potential VG200 of driving circuit 200 changes in response to ON/OFF of two driving circuits 100 and 200.

One of the two driving circuits 100 and 200 is turned ON, while the other one is turned off and vice versa by a pair of driving signals. When driving circuit 100 is at ON and driving circuit 200 is at OFF, ground potential VG200 of driving circuit 200 is at 0V. When driving circuit 100 is at OFF and driving circuit 200 is at ON, ground potential VG200 of driving circuit 200 becomes equal to power supply voltage V7 of dc voltage source 7.

Figure 8:
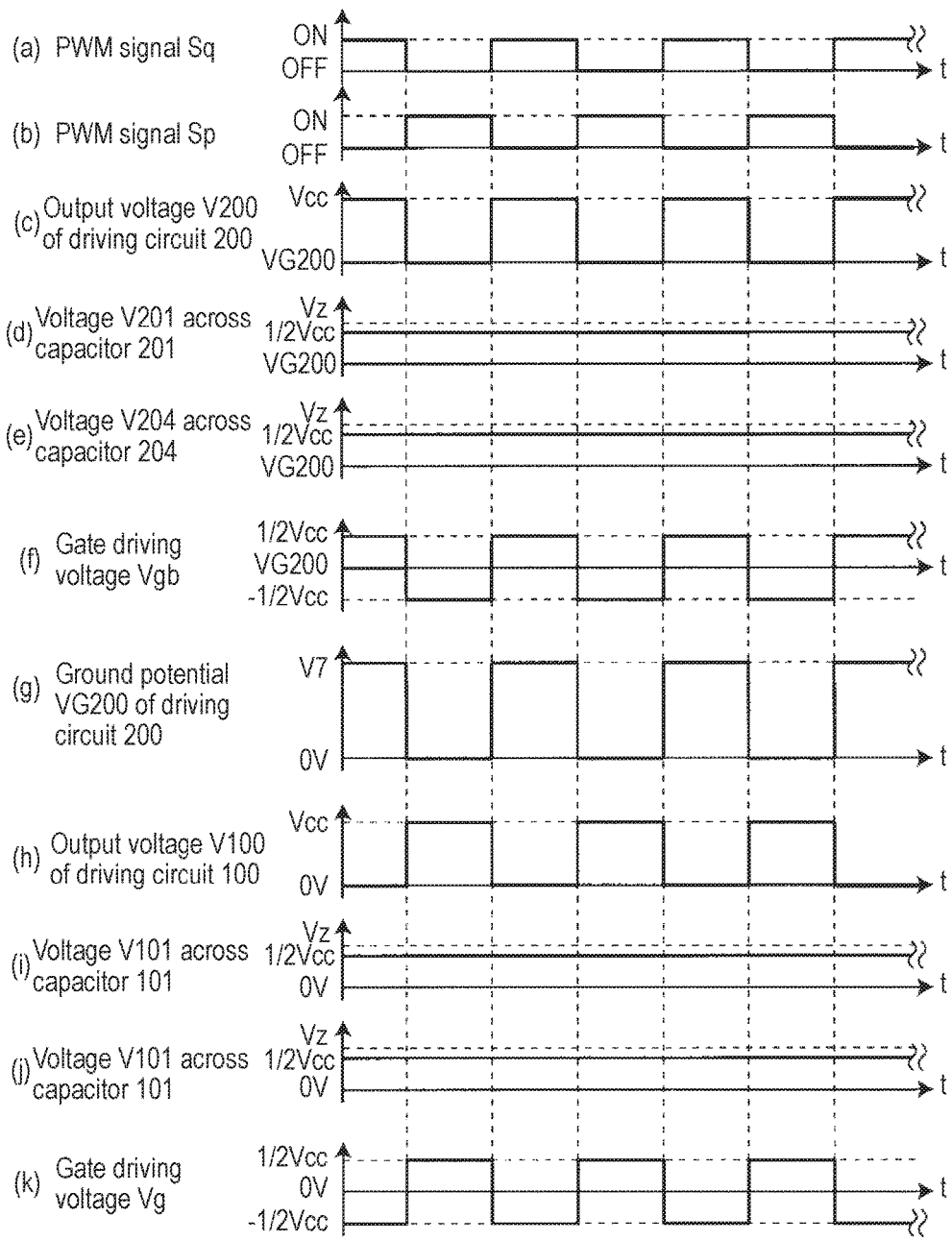
FIG. 8 is a timing chart showing operations of driving system 20 shown in FIG. 3 at on-duty ratio=50%.

FIG. 8 is a timing chart showing operations at ON duty ratio 50% in driving system 20.

In FIG. 8, when ground potential VG200 (denoted by (g) in FIG. 8) is 0 (zero) V, a first terminal (lower terminal in FIG. 8) of capacitor 6 shows 0V, and capacitor 6 is charged up to power supply voltage Vcc of dc voltage source 1 through diode 5. At this time, since PWM signal Sp is at OFF, output voltage V200 (denoted by (c) in FIG. 8) from driving circuit 200 becomes 0V which is ground potential VG200 of driving circuit 200. Voltage V201 (denoted by (d) in FIG. 8) across capacitor 201 is voltage 1/2 Vcc. Diode 203 is reversely biased, so that no electric current flows through diode 203, and driving device 10B outputs voltage −1/2 Vcc as gate driving voltage Vgb (denoted by (f) in FIG. 8) to gate G of insulated gate semiconductor element 3B.

On the other hand, when ground potential VG200 of driving circuit 200 is equal to power supply voltage V7 of dc voltage source 7, diode 5 is reversely biased, so that capacitor 6 is isolated from dc voltage source 1. Driving circuit 200 is driven by the voltage charged to capacitor 6 through referencing to ground potential VG200 of driving circuit 200 before driving circuit 200 operates. In other words, output voltage V200 from driving circuit 200 becomes voltage Vcc through referencing to power supply voltage V7, viz. ground potential VG200 of driving circuit 200, of dc voltage source 7. Since voltage V201 across capacitor 201 and voltage V204 across capacitor 204 (denoted by (e) in FIG. 8) are both equal to voltage 1/2 Vcc, driving device 10B outputs voltage 1/2 Vcc, referencing to power supply voltage V7, as gate driving voltage Vgb to gate G of insulated gate semiconductor element 3B.

3-3. Advantage

Driving system 20 for the insulated gate semiconductor element discussed above and in accordance with the third embodiment operates similar to driving device 10 in accordance with the first embodiment except that driving system 20 drives a pair of insulated gate semiconductor elements 3 and 3B alternately with each other.

Other Embodiments

The foregoing embodiments 1-3 are demonstrated for exemplifying techniques disclosed in the present disclosure, nevertheless, the techniques disclosed are not limited to these embodiments, and they can be applicable to other embodiments where changes, replacements, additions and omissions are appropriately done. The structural elements used in embodiments 1-3 can be combined, thereby producing a new embodiment.

In the embodiments discussed above, a PWM signal is used as a driving signal; however, the present disclosure is not limited to this instance, but it can use a given driving signal modulated by another method.

In the first and the second embodiments, a circuit formed of one diode or multiple diodes connected in series can be used instead of zener diodes 102 and 105. Diode 103 can employ a Schottky barrier diode, or a fast recovery diode.

In the third embodiment, zener diodes 202 and 205 can be replaced with a circuit formed of one diode or multiple diodes connected in series. Diode 203 can employ a Schottky barrier diode, or a fast recovery diode.

The driving devices in accordance with the first and second embodiments are particularly effective for the insulated gate semiconductor elements, featuring the ultrahigh-speed switching characteristics, such as GaN-FET, silicon carbide FET to enlarge a noise margin of the gate driving voltage. The driving devices however can be used for driving FET or IGBT (Insulated Gate Bipolar Transistor) made of conventional silicon.

In the third embodiment, driving system 20 for the insulated gate semiconductor element is formed of driving device 10 and driving device 10B having a structure similar to driving device 10 for the insulated gate semiconductor element, nevertheless, the present disclosure is not limited to this structure. For instance, in FIG. 3, driving devices 10 and 10B can be structured similarly to driving device 10A for the insulated gate semiconductor element.

INDUSTRIAL APPLICABILITY

The present disclosure is applicable to a driving circuit employing a transformer. This driving circuit drives the insulated gate semiconductor elements including such as a down-chopper switching power supply or an H-bridge circuit that drives a motor.

What is claimed is:

1. A driving device for an insulated gate semiconductor element driving the insulated gate semiconductor element in accordance with a given driving signal, the driving device comprising:
    a driving circuit operating with a single power supply in accordance with the driving signal;
    a first parallel circuit formed of a first capacitor and a first zener diode, and having a first end connected to an output terminal of the driving circuit;
    a series circuit connected between a second end of the first parallel circuit and a ground of the driving circuit, and formed of a diode and a second parallel circuit connected to each other in series, the second parallel circuit being formed of a second capacitor and a second zener diode; and
    a resistor connected between the second end of the first parallel circuit and the ground of the driving circuit,
    wherein a voltage across the resistor is used as an output voltage for driving the insulated gate semiconductor element, and
    wherein a voltage across the first capacitor is superimposed negative-wise on the output voltage for generating a negative voltage of the output voltage.

2. The driving device for the insulated gate semiconductor element according to claim 1, wherein the output terminal of the driving circuit is connected to a cathode of the first zener diode, and an anode of the first zener diode is connected to an anode of the diode, and
    wherein a cathode of the diode is connected to a cathode of the second zener diode, and an anode of the second zener diode is connected to the ground of the driving circuit.

3. The driving device for the insulated gate semiconductor element according to claim 1, wherein the output terminal of the driving circuit is connected to a cathode of the first zener diode, an anode of the first zener diode is connected to a cathode of the second zener diode, and
    wherein an anode of the second zener diode is connected to an anode of the diode, and a cathode of the diode is connected to the ground of the driving circuit.

4. A driving system for an insulated gate semiconductor element, the driving system comprising:
    a first driving device for the insulated gate semiconductor element that is the driving device as defined in claim 1;
    a second driving device for the insulated gate semiconductor element that is the driving device as defined in claim 1;
    a third capacitor connected between both terminals of a power supply of a driving circuit of the second driving device, the driving circuit working as an input-output isolation type driving circuit;
    a first single power supply, viz. the single power supply for driving a driving circuit of the first driving device and the driving circuit of the second driving device; and
    a second diode connected between the first single power supply and the driving circuit of the second driving device,
    wherein the driving circuit of the first driving device and the driving circuit of the second driving device are driven in different time periods from each other by a pair of driving signals having reverse polarities to each other.

5. The driving system for the insulated gate semiconductor element according to claim 4, further comprising a second single power supply between an output terminal of the second driving device and a ground of the driving circuit of the first driving device via an insulated gate semiconductor element to be driven by the second driving device.

* * * * *